United States Patent
Lee et al.

(10) Patent No.: US 8,013,522 B2
(45) Date of Patent: Sep. 6, 2011

(54) ORGANIC LIGHT EMITTING DEVICE WITH TRANSFLECTIVE MEMBERS

(75) Inventors: Sung-Soo Lee, Suwon-si (KR); Chang-Woong Chu, Suwon-si (KR); Seong-Min Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

(21) Appl. No.: 12/463,754

(22) Filed: May 11, 2009

(65) Prior Publication Data

US 2010/0066242 A1    Mar. 18, 2010

(30) Foreign Application Priority Data

Sep. 12, 2008    (KR) .................. 10-2008-0090349

(51) Int. Cl.
*H01J 1/62* (2006.01)
*H01J 63/04* (2006.01)

(52) U.S. Cl. ........ 313/504; 313/498; 313/506; 313/512; 313/112; 313/113

(58) Field of Classification Search .......... 313/498–512, 313/112, 113
See application file for complete search history.

(56) References Cited

U.S. PATENT DOCUMENTS

| | | | |
|---|---|---|---|
| 2009/0206733 A1* | 8/2009 | Hwang et al. | 313/504 |
| 2009/0212694 A1* | 8/2009 | Cok | 313/506 |
| 2009/0261716 A1* | 10/2009 | Choi et al. | 313/504 |
| 2009/0267486 A1* | 10/2009 | Kim et al. | 313/503 |
| 2009/0267495 A1* | 10/2009 | Jung et al. | 313/504 |
| 2010/0060148 A1* | 3/2010 | Hwang et al. | 313/504 |
| 2010/0072882 A1* | 3/2010 | Hwang et al. | 313/504 |
| 2010/0072883 A1* | 3/2010 | Hwang et al. | 313/504 |

* cited by examiner

*Primary Examiner* — Karabi Guharay
*Assistant Examiner* — Kevin Quarterman
(74) *Attorney, Agent, or Firm* — F. Chau & Associates, LLC

(57) ABSTRACT

An organic light emitting device includes a substrate including a first region, a second region, a third region, and a fourth region, a thin film structure formed on the substrate, first, second, and third color filters formed on the thin film structure, and respectively disposed in the first, second, and third regions, an insulating layer formed on the first to third color filters and the thin film structure, first, second, third, and fourth translucent members formed on the insulating layer, and respectively disposed in the first, second, third, and fourth regions, first, second, third, and fourth pixel electrodes respectively formed on the first, second, third, and fourth translucent members, an organic light emitting member for emitting white light formed on the first to fourth pixel electrodes; and a common electrode formed on the organic light emitting member.

21 Claims, 9 Drawing Sheets

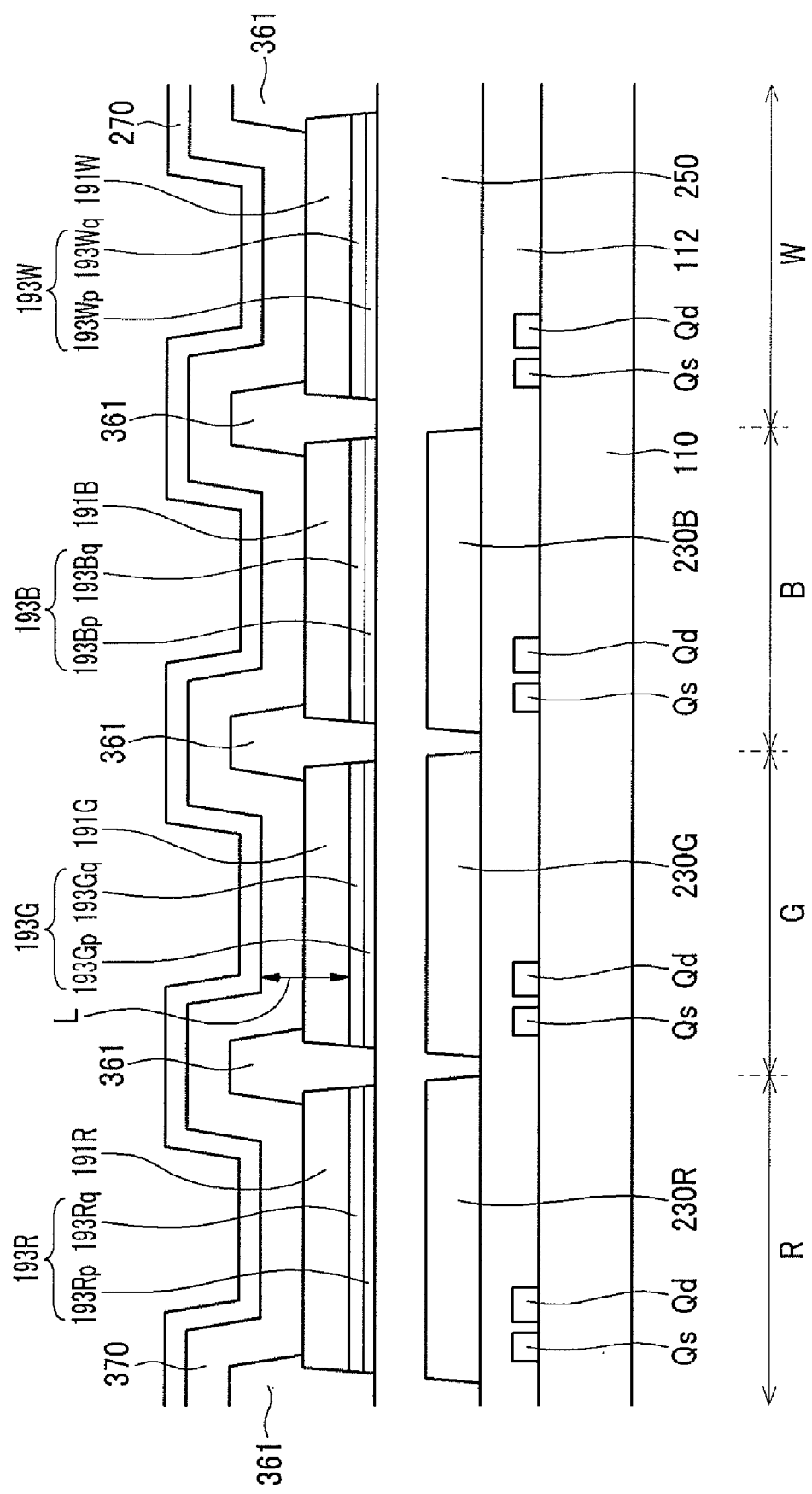

ORGANIC LIGHT EMITTING DEVICE WITH TRANSFLECTIVE MEMBERS

CROSS-REFERENCE TO RELATED APPLICATION

This application claims priority to and the benefit of Korean Patent Application No. 10-2008-0090349 filed in the Korean Intellectual Property Office on Sep. 12, 2008, the entire contents of which are incorporated herein by reference.

BACKGROUND OF THE INVENTION (a) Technical Field

The present invention relates to an organic light emitting device.

(b) Discussion of the Related Art

An organic light emitting device includes a plurality of pixels, and each pixel includes an organic light emitting element and a plurality of thin film transistors for driving the organic light emitting element.

The organic light emitting element includes an anode, a cathode, and an organic light emitting member disposed therebetween, and the organic light emitting member emits light of three primary colors such as red, green, and blue. Materials used vary according to the colors that the organic light emitting member emits, and a method of emitting white light, in which light emitting materials that emit red, green, and blue are stacked so that the synthesized light becomes white, has been used.

Moreover, in a case where the organic light emitting member emits a white light, a color filter is added to obtain light of a desired color.

However, due to the limitation in color reproducibility of the color filters themselves, light that passes through the color filters is bound to have color reproducibility which at best may be the same as or more likely lower than the color reproducibility of the color filters. As a result of the limitation in color reproducibility of the color filters, such high color reproducibility as required by the National Television Systems Committee ("NTSC") is difficult to achieve from the light that passes through the color filters.

SUMMARY OF THE INVENTION

Embodiments of the present invention provide an organic light emitting device capable of achieving high color reproducibility with white emission.

An organic light emitting device according to an exemplary embodiment of the present invention includes a substrate including a first region, a second region, a third region, and a fourth region, a thin film structure formed on the substrate, first, second, and third color filters formed on the thin film structure, and respectively disposed in the first, second, and third regions, an insulating layer formed on the first to third color filters and the thin film structure, first, second, third, and fourth transflective members formed on the insulating layer, and respectively disposed in the first, second, third, and fourth regions, first, second, third, and fourth pixel electrodes respectively formed on the first, second, third, and fourth transflective members, an organic light emitting member for emitting white light formed on the first to fourth pixel electrodes; and a common electrode formed on the organic light emitting member.

Each thickness between the upper surface of the first, second, third, and fourth transflective members and the lower surface of the common electrode may be the same in the first, second, third, and fourth regions.

The thickness between the upper surface of the first, second, third, and fourth transflective members and the lower surface of the common electrode may be in the range of 6100 Å to about 6700 Å, respectively.

The first, second, third, and the fourth transflective members may include silver, aluminum, or magnesium.

The insulating layer may include an organic material.

The first, second, third, and fourth transflective members may have a dual-layer structure.

A lower layer of the first, second, third, and fourth transflective members may include ITO or IZO, and an upper layer of the first, second, third, and fourth transflective members may include silver, aluminum, or magnesium.

The insulating layer may include an inorganic material.

The insulating layer may include silicon oxide or silicon nitride.

An organic light emitting device according to an exemplary embodiment of the present invention includes a thin film structure formed on a substrate, an insulating layer formed on the thin film structure, a first transflective member formed on the insulating layer, a first pixel electrode formed on the first transflective member, an organic light emitting member for emitting white light formed on the first pixel electrode, and a common electrode formed on the organic light emitting member, wherein a thickness between an upper surface of the transflective member and a lower surface of the common electrode is in range of 6100 Å to about 6700 Å.

The first transflective member may include silver, aluminum, or magnesium.

The insulating layer may include an organic material.

The first transflective member may have a dual-layer structure.

The lower layer of the first transflective member may include ITO or IZO, and the upper layer of the first transflective member may include silver, aluminum, or magnesium.

The insulating layer may include an inorganic material.

The insulating layer may include silicon oxide or silicon nitride.

The organic light emitting device may further include a color filter formed between thin film structure and the insulating layer, a second transflective member disposed on the color filter, and a second pixel electrode formed on the second transflective member, and the thickness between the upper surface of the second transflective member and the lower surface of the common electrode is in the range of 6100 Å to about 6700 Å.

The second transflective member may include silver, aluminum, or magnesium.

The second transflective member may have a dual-layer structure.

The lower layer of the second transflective member may include ITO or IZO, and the upper layer may include silver, aluminum, or magnesium.

The color filter may be one of red, green, and blue color filters.

Accordingly, the color reproducibility of the organic light emitting device may be improved.

BRIEF DESCRIPTION OF THE DRAWINGS

Exemplary embodiments of the present invention will be described in more detail hereinafter below with reference to the attached drawings in which:

FIG. 11 is a cross-sectional view of an organic light emitting device according to an exemplary embodiment of the present invention.

DETAILED DESCRIPTION OF THE EMBODIMENTS

Figure 1:
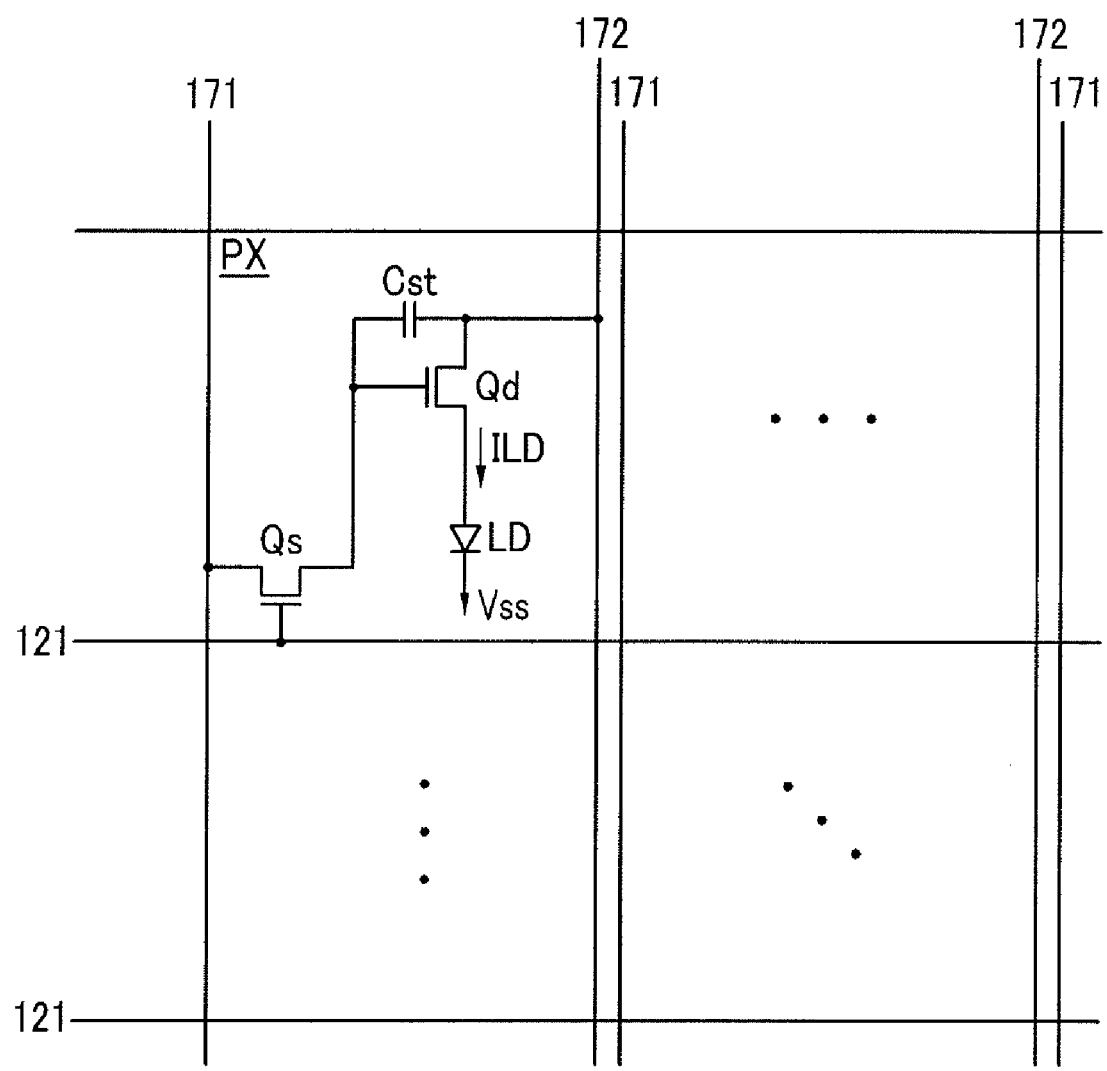
FIG. 1 is an equivalent circuit schematic diagram of an OLED display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

FIG. 1 is an equivalent circuit schematic diagram of an OLED display according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 extend substantially in a column direction and substantially parallel to each other. The driving voltage lines 172 extend substantially in a column direction and substantially parallel to each other, however they may extend in the row direction or the column direction, and in a shape such as a mesh shape.

Each pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD, which can be an organic light emitting diode (OLED), has an anode connected to the output terminal of the driving transistor Qd and a cathode connected to a common voltage Vss. The organic light emitting element LD emits light having an intensity depending on an output current ILD of the driving transistor Qd, thereby displaying images.

The switching transistor Qs and the driving transistor Qd are n-channel field effect transistors (FETs), however at least one may be a p-channel FET. In addition, the connections among the transistors Qs and Qd, the capacitor Cst, and the organic light emitting diode LD may be modified.

If necessary, other transistors for compensating the threshold voltage of the driving transistor Qd or the organic light emitting element LD may be included in addition to the switching transistor Qs and the driving transistor Qd.

Figure 2:
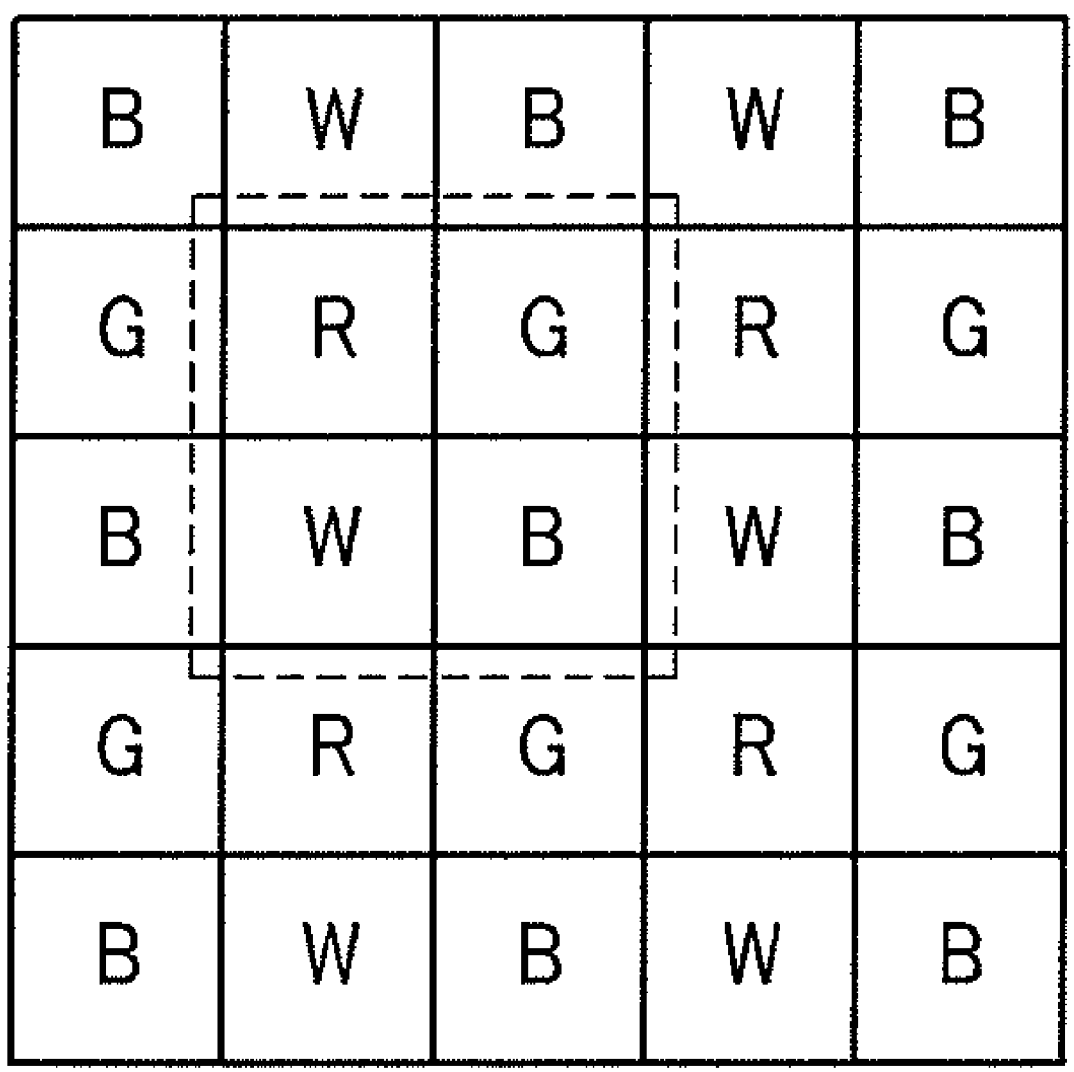
FIG. 2 is a top plan view showing disposition of a plurality of pixels in the organic light emitting device according to an exemplary embodiment of the present invention.

A disposition of pixels of an organic light emitting device according to an exemplary embodiment of the present invention will be described with reference to FIG. 2. FIG. 2 is a top plan view showing disposition of a plurality of pixels in an OLED display according to an exemplary embodiment of the present invention.

Referring to FIG. 2, the organic light emitting device according to an exemplary embodiment of the present invention includes red pixels R for displaying a red color, green pixels G for displaying a green color, blue pixels B for displaying a blue color, and white pixels W to not display a predetermined color, which are sequentially and alternately disposed. The red pixels R, the green pixels G, and the blue pixels B are primary pixels to display full colors, and the white pixels W enhance the luminance.

Four pixels of a red pixel R, a green pixel G, a blue pixel B, and a white pixel W form one group, and may be repeatedly arranged according to rows and/or columns. However, the arrangement and the shape of the pixels may vary.

All pixels of the organic light emitting device according to an exemplary embodiment of the present invention, that is, the red pixel R, the blue pixel B, the green pixel G, and the white pixel W, include the same micro-cavity structure.

The structure of a pixel group of an organic light emitting device according to an exemplary embodiment of the present invention will be described with reference to FIG. 3.

Figure 3:
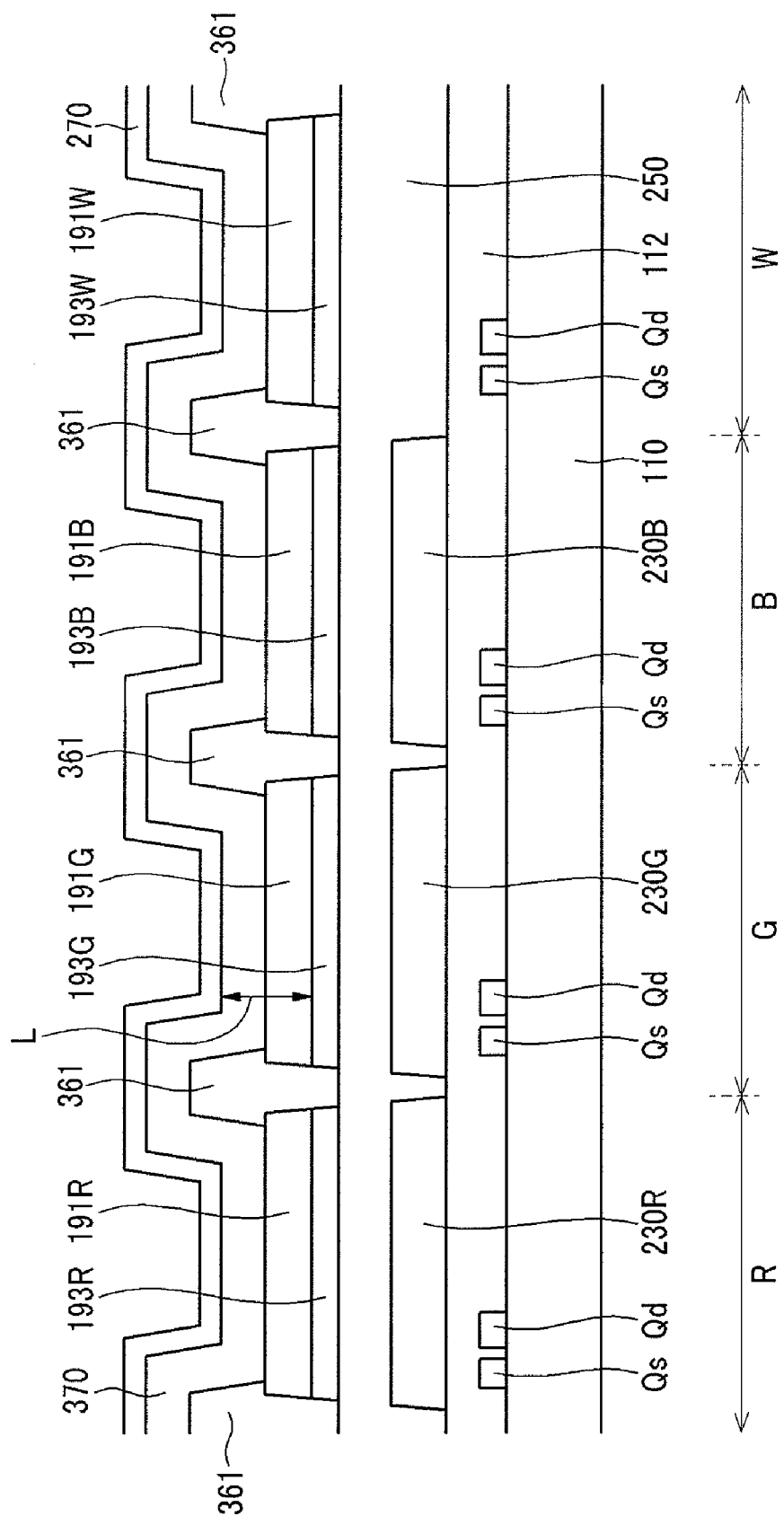
FIG. 3 is a cross-sectional view showing the organic light emitting device according to an exemplary embodiment of the present invention.

FIG. 3 is a cross-sectional view of an organic light emitting device according to an exemplary embodiment of the present invention.

An organic light emitting device according to an exemplary embodiment includes a red pixel R, a green pixel G, a blue pixel B, and a white pixel W. Three different primary colors may be included instead of the three primary colors of red, green, and blue.

In the drawings, portions related to the red pixel R, the green pixel G, the blue pixel B, and the white pixel W have "R", "G", "B", and "W" respectively attached to each reference numeral with respect thereto.

A plurality of driving transistors Qd and a plurality of switching transistors Qs are formed on an insulation substrate 110 made of transparent glass or plastic. Other thin film structures 112 are formed on the substrate 110. Among the thin film structures, an insulating layer covering the driving transistor Qd and the switching transistor Qs may be formed, and other thin film structures are formed under the driving transistors Qd and the switching transistors Qs.

A red color filter 230R, a green color filter 230G, and a blue color filter 230B are formed on the thin film structure 112. In the white pixel W, a color filter is not formed or a transparent white color filter (not shown) may be formed.

An overcoat 250 is formed the color filters 230R, 230G, and 230B and the thin film structures 112. When there is no color filter in the white pixel W, the overcoat 250 contacts the thin film structure 112 in this region.

The overcoat 250 is made of an inorganic insulator such as silicon nitride (SiNx) or silicon oxide (SiOx), and may have a flat surface. The overcoat 250 has a plurality of through holes (not shown) disposed over the driving transistors Qd.

Transflective members 193R, 193G, 193B, and 193W are formed on the overcoat 250. The transflective members 193R, 193G, 193B, and 193W are disposed on the color filters 230R, 230G, and 230B, and at the white pixel W, and have the same shape in the red pixel R, the blue pixel B, the green pixel G, and the white pixel W. The transflective members 193R, 193G, 193B, and 193W form a micro-cavity along with a common electrode 270.

The transflective members 193R, 193G, 193B, and 193W may be made of a highly reflective metal such as silver (Ag), magnesium (Mg), or aluminum (Al), or alloys thereof, and the thickness thereof may be in the range of about 100 Å-about 200 Å. Even when the metal is used, if it is thin, the metal has a transflective characteristic in which incident light is both reflected and transmitted.

Although not shown, an insulating layer may be formed on the transflective members 193R, 193G, 193B, and 193W, and the overcoat 250 to prevent the oxidation of the transflective members 193R, 193G, 193B, and 193W.

A plurality of pixel electrodes 191R, 191G, 191B, and 191W are formed on the transflective members 193R, 193G, 193B, and 193W. The pixel electrodes 191R, 191G, 191B, and 191W are made of a transparent conductor such as ITO, IZO, or ZnO, and the thickness thereof may be in the range of about 300 Å-about 3000 Å. The pixel electrodes 191R, 191G, 191B, and 191W are electrically connected to the driving transistor Qd through contact holes (not shown) formed in the overcoat 250, and may function as anodes. Each of the pixel electrodes 191R, 191G, 191B, and 191W have the same thickness in the red pixel R, the blue pixel B, the green pixel G, and the white pixel W.

A plurality of insulating members 361 defining the pixels are formed on each of the pixel electrodes 191R, 191B, 191G, and 191W, and an organic light emitting member 370 is formed on the insulating member 361 and the pixel electrodes 191R, 191B, 191G, and 191W.

The organic light emitting member 370 may include an emission layer (not shown) for emitting light, and an auxiliary layer (not shown) for enhancing the emitting efficiency of the emission layer.

The organic light emitting member 370 may include a plurality of sub-emission layers (not shown) that are formed by sequentially depositing materials respectively emitting light such as red, green, and blue light. The sub-emission layers may emit white light by combining the colors thereof. The sub-emission layers may be vertically or horizontally deposited, and they are not limited to red, green, and blue and may be formed by combining various colors when emitting the white color.

The auxiliary layer may be at least one selected from an electron transport layer, a hole transport layer, an electron injection layer, and a hole injection layer.

The common electrode 270 is formed on the organic light emitting member 370. The common electrode 270 may be made of a reflective metal such as Ca, Ba, Mg, Al, and Ag, and functions as a cathode electrode. The common electrode 270 is formed on the whole surface of the substrate 110, and forms a pair with the pixel electrodes 190R, 190G, 190B, and 190W, which function as anode electrodes to flow the current to the organic light emitting member 370.

In an exemplary embodiment of the present invention, each of the red pixel R, the blue pixel B, the green pixel G, and the white pixel W respectively includes the transflective members 193R, 193G, 193B, and 193W, forming the micro-cavity structures along with the common electrode 270.

In the organic light emitting device according to an exemplary embodiment of the present invention, an interval L between the upper part of the transflective members 193R, 193G, 193B, and 193W and the lower part of the common electrode 270, that is, the sum of the thicknesses of the multilayer formed between the transflective members 193R, 193G, 193B, and 193W, and the common electrode 270, may be in the range of about 6100 Å to about 6700 Å, and more particularly, about 6400 Å. In an exemplary embodiment of the present invention, the multilayer formed between the transflective members 193R, 193G, 193B, and 193W, and the common electrode 270, may be the pixel electrodes 191R, 191B, 191G, and 191W, and the organic light emitting member 370. However, another layer may be formed between the transflective members 193R, 193G, 193B, and 193W, and the common electrode 270, in addition to the pixel electrodes 191R, 191B, 191G, and 191W and the organic light emitting member 370. When the multilayers formed between the transflective members 193R, 193G, 193B, and 193W, and the common electrode 270, are the pixel electrodes 191R, 191B, 191G, and 191W, and the organic light emitting member 370, as an example, if the thickness of the organic light emitting member 370 is about 2000 Å, the thickness of the pixel electrodes 191R, 191B, 191G, and 191W may be about 4400 Å.

The organic light emitting device emits light in the lower direction of the substrate 110 to display the images. The emitted light from the organic emission layer of the organic light emitting member 370 toward the substrate 110 passes through the pixel electrodes 191R, 191B, 191G, and 191W, and arrives at the transflective members 193R, 193G, 193B, and 193W. The transflective members 193R, 193G, 193B, and 193W reflect the incident light toward the common electrode 270, and the common electrode 270 reflects the light back toward transflective members 193R, 193G, 193B, and 193W. Accordingly, the light being reflected between the transflective members 193R, 193G, 193B, and 193W, and the common electrode 270, is subject to an optical process, and passes through the transflective members 193R, 193G, 193B, and 193W and the color filters 230R, 230G, and 230B to the outside if appropriate conditions are satisfied.

In a micro-cavity structure, light is repeatedly reflected between a reflection layer and a transflective layer that are separated by a predetermined distance (an optical length) such that light of a specific wavelength is developed. Here, the common electrode 270 functions as the reflection layer, and the transflective members 193R, 193G, 193B, and 193W function as the transflective layer. Due to the micro-cavity structure, light near a wavelength corresponding to the resonance wavelength of the micro-cavity among the light emitted from the organic emission layer is enhanced through constructive interference, while light of different wavelengths is suppressed by destructive interference. In the micro-cavity structure, the wavelength range of the enhanced light may be determined according to the path of the light.

According to an exemplary embodiment of the present invention, the path of the light is changed according to the thickness of the thin firms between the transflective members 193R, 193G, 193B, and 193W, and the common electrode 270. The thickness L between the upper surface of the transflective members 193R, 193G, 193B, and 193W, and the lower surface of the common electrode 270, that is, the total thickness of the layers formed between the transflective members 193R, 193G, 193B, and 193W, and the common electrode 270, may be in the range of about 6100 Å to about 6700 Å, and more particluarly about 6400 Å, and when the interval L has this thickness, high color reproducibility may be obtained.

According to an exemplary embodiment of the present invention, the red pixel R, the blue pixel B, the green pixel G, and the white pixel W include the transflective members 193R, 193G, 193B, and 193W, and the pixel electrodes 191R, 191G, 191B, and 191W with the same thickness, thereby forming the micro-cavity structure. Accordingly, although the micro-cavity structures of each pixel are the same, high color reproducibility may be obtained, and the manufacturing process is simplified such that the production ratio may be increased and the manufacturing cost may be reduced.

Next, the color reproducibility of the organic light emitting device according to experimental examples of the present invention will be described with reference to FIG. 4 to FIG. 7.

Figure 4:
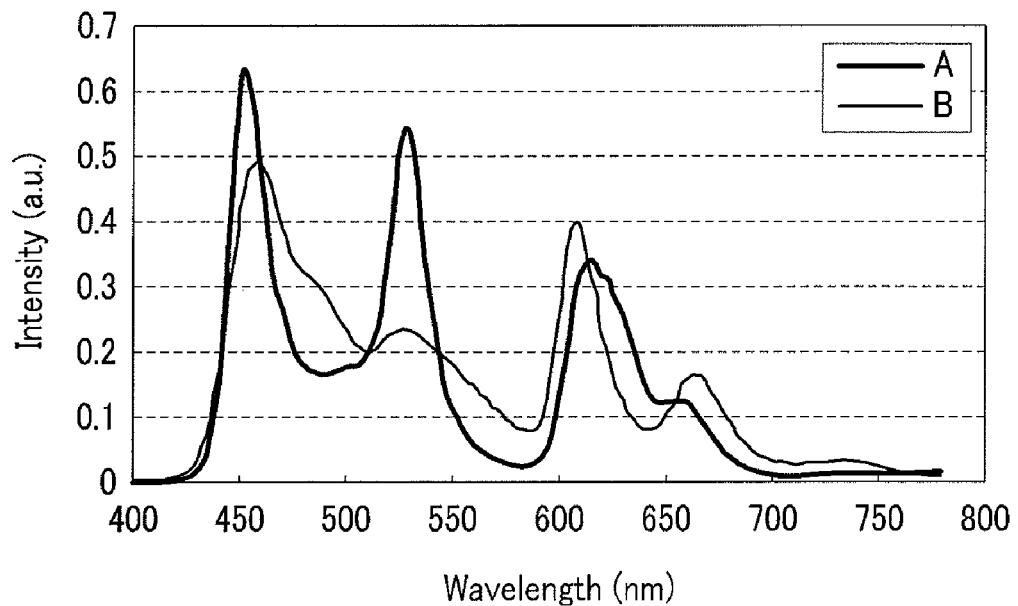
FIG. 4 is a graph showing intensity of light according to a wavelength of a white pixel in an organic light emitting device according to an exemplary embodiment of the present invention.
Figure 5:
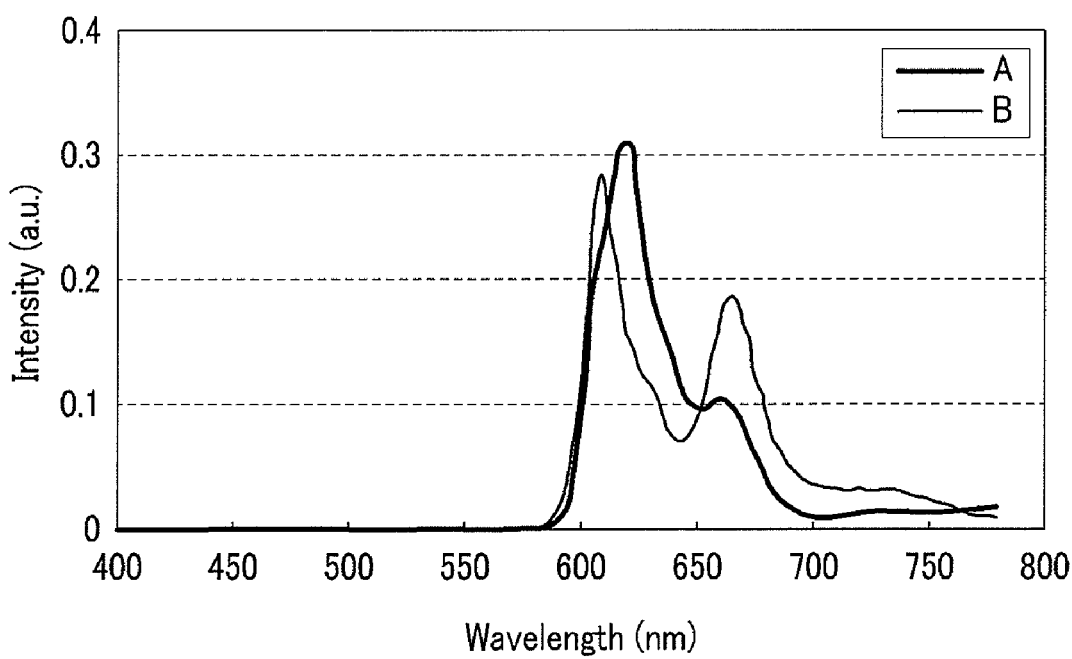
FIG. 5 is a graph showing intensity of light according to a wavelength of a red pixel in an organic light emitting device according to an exemplary embodiment of the present invention.
Figure 6:
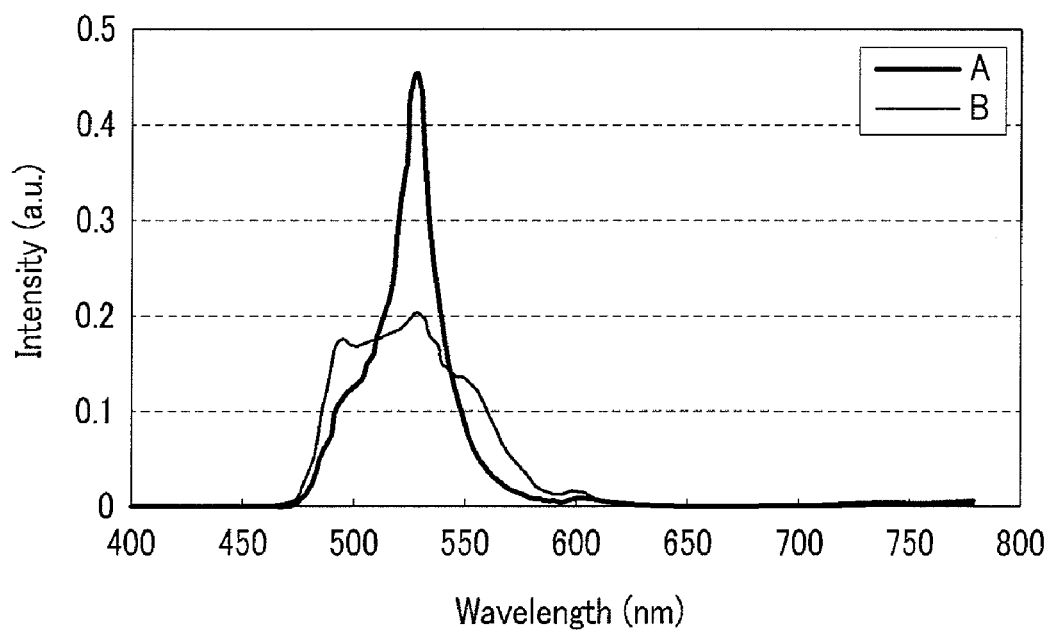
FIG. 6 is a graph showing intensity of light according to a wavelength of a green pixel in an organic light emitting device according to an exemplary embodiment of the present invention.
Figure 7:
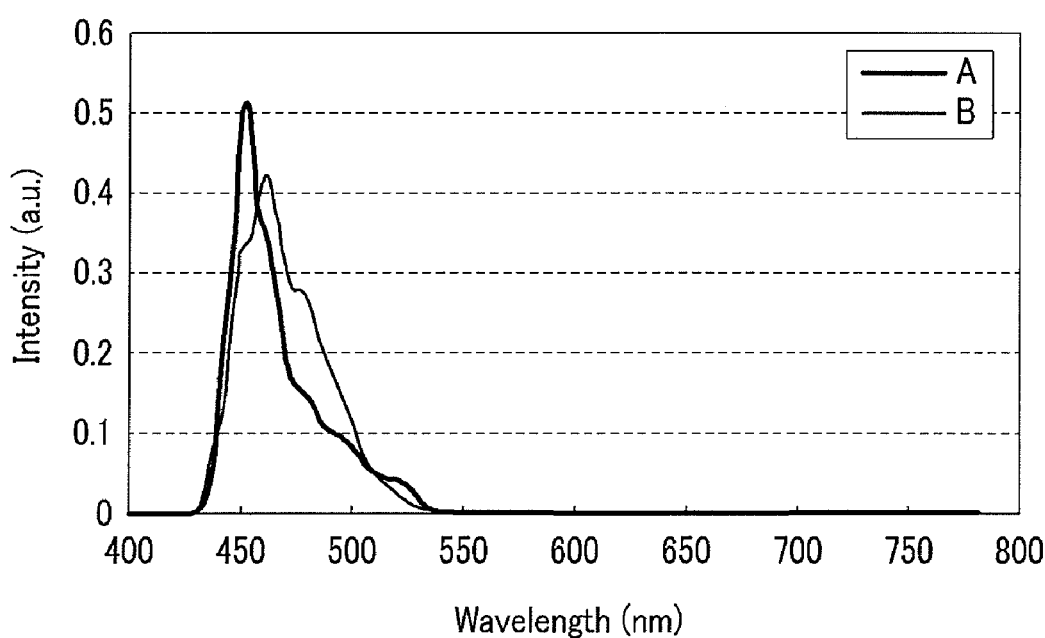
FIG. 7 is a graph showing intensity of light according to a wavelength of a blue pixel in an organic light emitting device according to an exemplary embodiment of the present invention.

FIG. 4 is a graph showing intensity of light according to a wavelength of a white pixel in an organic light emitting device according to an exemplary embodiment of the present invention, FIG. 5 is graph showing intensity of light according to a wavelength of a red pixel in an organic light emitting device according to an exemplary embodiment of the present invention, FIG. 6 is a graph showing intensity of light according to a wavelength of a green pixel in an organic light emitting device according to an exemplary embodiment of the present invention, and FIG. 7 is a graph showing intensity of light according to a wavelength of a blue pixel in an organic light emitting device according to an exemplary embodiment of the present invention.

In the experimental examples, as an exemplary embodiment of the present invention, the thickness L between the upper surface of the transflective member 193 and the lower surface of the common electrode 270 in all pixels, that is, the total thickness of the multilayers formed between the transflective members 193R, 193G, 193B, and 193W, and the common electrode 270, is in the range of about 6100 Å to about 6700 Å, and the intensity of light according to the wavelength of the white pixel W, the red pixel R, the green pixel G, and the blue pixel B was measured, and compared with the intensity of the conventional structure provided with a conventional white and color filters without a micro-cavity. In the graphs, A is the intensity according to the wavelength of the light of the pixel in the organic light emitting device according to an exemplary embodiment of the present invention, and B is the intensity according to the wavelength of the light in the conventional structure.

Referring to FIG. 4, in the case of the white pixel W according to an exemplary embodiment of the present invention, high intensity, shown at the peaks, is measured under all wavelengths compared with the light of the conventional structure. Particularly, the higher intensity was observed in the short wavelength range of blue and green.

Referring to FIG. 5, in the case of the red pixel R, compared with the light of the conventional structure, a large value was observed, as shown at the peak, and the light was emitted in a narrow wavelength range.

Referring to FIG. 6 and FIG. 7, in the case of the green pixel G and the blue pixel B, compared with the light of the conventional structure, a large intensity is shown at the peaks in the green pixel G and the blue pixel B according to an exemplary embodiment of the present invention, and the light is emitted in a narrow wavelength range, particularly in the case of the green pixel G, and the difference of the intensity of the light is large at the peak, while the range of the wavelength of the emitted light is narrow such that the wavelength of the green light does not overlap with the wavelength of the blue or the red light.

In the case of the organic light emitting device according to an exemplary embodiment of the present invention, a strong emitting intensity appears in the narrow wavelength range through all of the red pixel R, the blue pixel B, and the green pixel G. Having the peaks in the narrow wavelength range means that the color purity and the color reproducibility are increased, and the emitting intensity being increased means that the light efficiency is improved.

Figure 8:
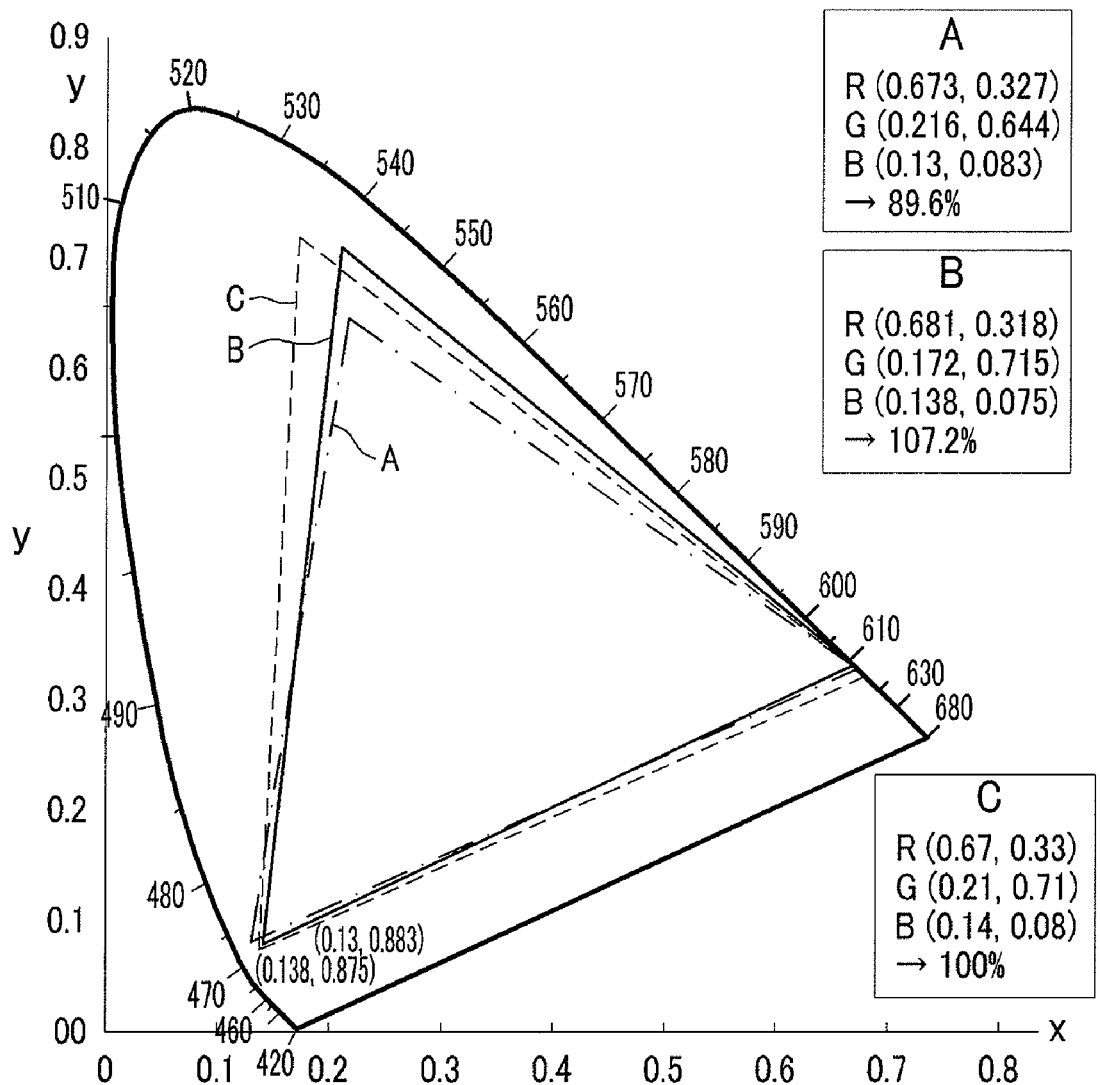
FIG. 8 shows color coordinates of color reproducibility of an organic light emitting device according to an exemplary embodiment of the present invention.

Next, color reproducibility of an organic light emitting device according to an exemplary embodiment of the present invention will be described with reference to FIG. 8. FIG. 8 shows color coordinates of color reproducibility of an organic light emitting device according to an exemplary embodiment of the present invention. In FIG. 8, A is a color coordinate of general light, B is a color coordinate of an organic light emitting device according to an exemplary embodiment of the present invention, and C is a color coordinate according to the NTSC.

Referring to FIG. 8, when the region of NTSC is 100% of color reproducibility, the general light has color reproducibility of about 89.6%, however the organic light emitting device according to an exemplary embodiment of the present invention has high color reproducibility of about 107.2%.

Accordingly, the color reproducibility may be remarkably improved compared with the conventional structure.

Next, an organic light emitting device according to an exemplary embodiment of the present invention will be described with reference to FIG. 9 and FIG. 10.

Figure 9:
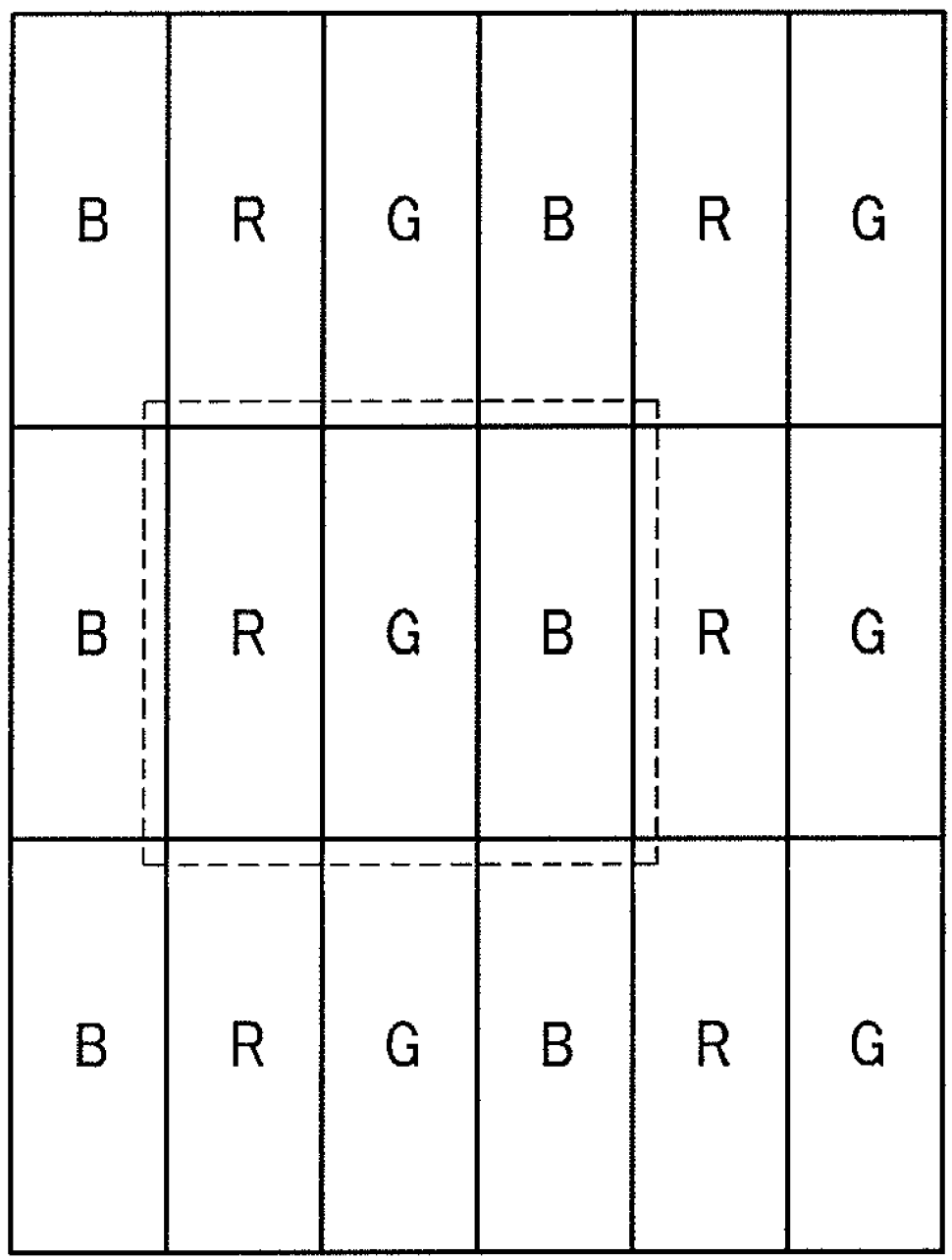
FIG. 9 is a top plan view of a disposition of a plurality of pixels in an OLED display according to an exemplary embodiment of the present invention.
Figure 10:
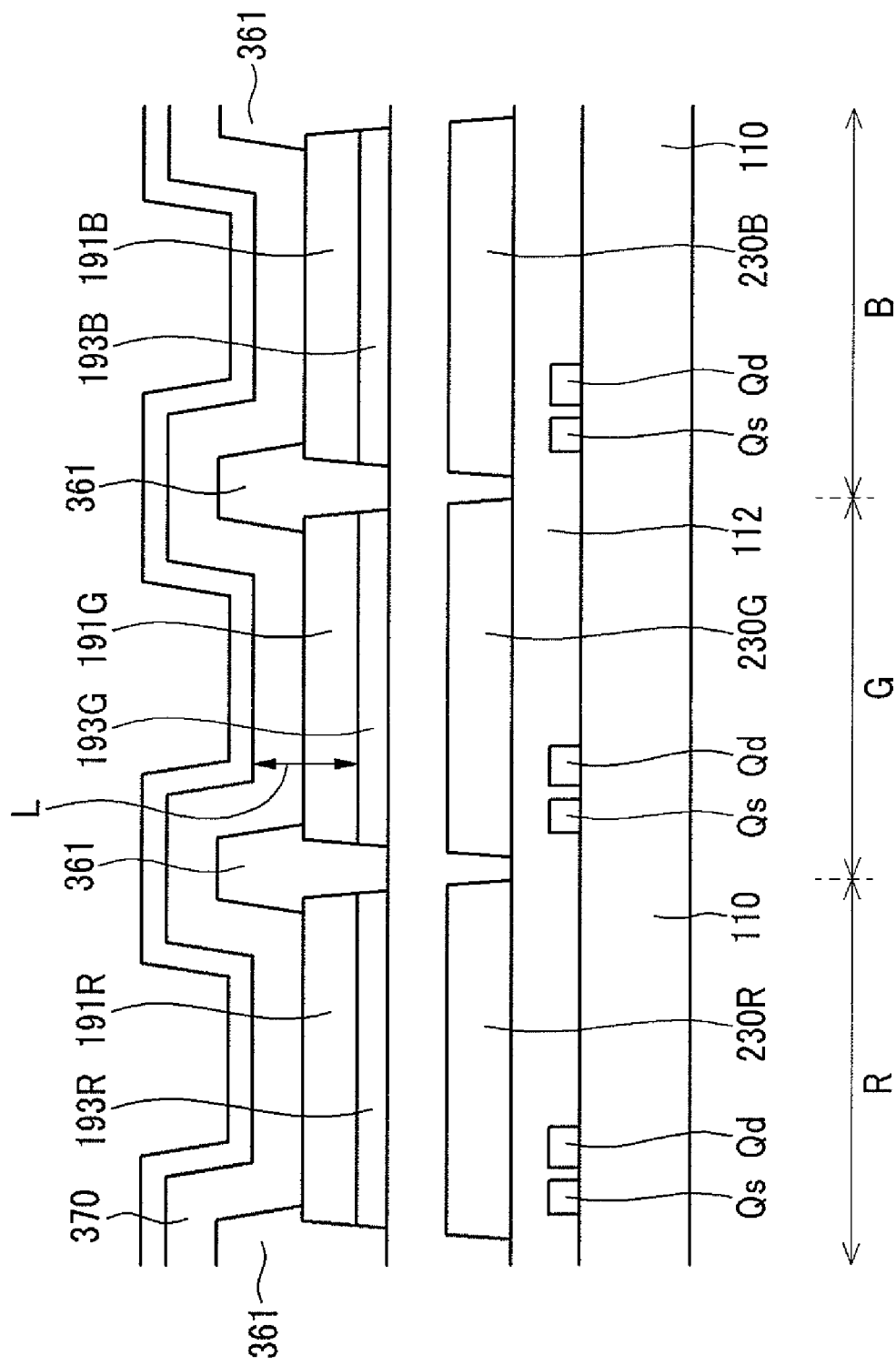
FIG. 10 is a cross-sectional view of an organic light emitting device according to an exemplary embodiment of the present invention.

FIG. 9 is a top plan view of a disposition of a plurality of pixels in the OLED display according to an exemplary embodiment of the present invention, and FIG. 10 is a cross-sectional view of an organic light emitting device according to an exemplary embodiment of the present invention.

Referring to FIG. 9, the organic light emitting device according to an exemplary embodiment of the present invention includes red pixels R for displaying a red color, green pixels G for displaying a green color, and blue pixels. B for displaying a blue color, which are sequentially and alternately disposed. Different from the organic light emitting device shown in FIG. 2 and FIG. 3, the white pixel W is omitted.

Referring to FIG. 10, with the exception of the omitted white pixel, the organic light emitting device according to the present exemplary embodiment has the same deposition structure as the organic light emitting device shown in FIG. 3, and particularly the red pixel R, the blue pixel B, and the green pixel G have the micro-cavity structure.

In the organic light emitting device of the present exemplary embodiment, the thickness L between the upper surface of the transflective members 193R, 193G, 193B, and 193W, and the lower surface of the common electrode 270, or the total thickness of the multilayer formed between the transflective members 193R, 193G, 193B, and 193W, and the common electrode 270, that is, the micro-cavity, has a thickness of about 6100 Å to about 6700 Å, and more precisely about 6400 Å.

Various characteristics of the organic light emitting device shown in FIG. 2 to FIG. 3 are also applicable to the organic light emitting device shown in FIG. 9 and FIG. 10.

Next, an organic light emitting device according to an exemplary embodiment of the present invention will be described with reference to FIG. 11. FIG. 11 is a cross-sectional view of an organic light emitting device according to an exemplary embodiment of the present invention.

The layered structure of the organic light emitting device according to the present exemplary embodiment is similar to the organic light emitting device according to the exemplary embodiment shown in FIG. 3.

A plurality of driving transistors Qd and a plurality of switching transistors Qs are formed on an insulation substrate 110, and a thin film structure 112 including an insulating layer is formed thereon.

A red color filter 230R, a green color filter 230G, and a blue color filter 230B are formed on the thin film structure 112, and an overcoat 250 is formed on the color filters 230R, 230G, and 230B and the thin film structure 112.

Transflective members 193R, 193G, 193B, and 193W, which are the same shape in the red pixel R, the blue pixel B, the green pixel G, and the white pixel W, are formed the overcoat 250.

A plurality of pixel electrodes 191R, 191G, 191B, and 191W are formed on the transflective members 193R, 193G, 193B, and 193W.

A plurality of insulating members 361 for defining each pixel are formed on the pixel electrodes 191R, 191B, 191G, and 191W, and an organic light emitting member 370 is formed on the insulating members 361 and the pixel electrodes 191R, 191B, 191G, and 191W.

A common electrode 270 is formed on the organic light emitting member 370.

However, different from the organic light emitting device of FIG. 3, the transflective members 193R, 193G, 193B, and 193W of the organic light emitting device shown in FIG. 11 have a dual-layer structure including lower layers 193Rp, 193Gp, 193Bp, and 193Wp, and upper layers 193Rq, 193Gq, 193Bq, and 193Wq. The lower transflective members 193Rp, 193Gp, 193Bp, and 193Wp are made of indium tin oxide (ITO) or indium zinc oxide (IZO), and the upper transflective members 193Rq, 193Gq, 193Bq, and 193Wq are made of a metal having high reflectance such as silver (Ag), aluminum (Al), magnesium (Mg), or alloys thereof. The overcoat 250 of the organic light emitting device shown in FIG. 11 may be made of an organic insulator.

The lower transflective members 193Rp, 193Gp, 193Bp, and 193Wp enhance the adhesion characteristics between the upper transflective members 193Rq, 193Gq, 193Bq, and 193Wq, and the overcoat 250 made of the organic insulator, thereby preventing the upper transflective members 193Rq, 193Gq, 193Bq, and 193Wq from being lifted.

In the organic light emitting device according to the present exemplary embodiment, the thickness L between the upper surface of the transflective members 193R, 193G, 193B, and 193W, and the lower surface of the common electrode 270, that is, the total thickness of the multilayer formed between the transflective members 193R, 193G, 193B, and 193W, and the common electrode 270, may be in the range of about 6100 Å to about 6700 Å, and more specifically about 6400 Å. That is, the thickness of the micro-cavity structure of the organic light emitting device according to the present exemplary embodiment may be in the range of about 6100 Å to about 6700 Å, and more specifically about 6400 Å, such that high color reproducibility may be obtained through this thickness. In this way, in the case according to the present exemplary embodiment, although the micro-cavity structures are the same for each pixel, the high color reproducibility may be obtained, and the manufacturing process may be simplified to thereby increase the production ratio and reduce the manufacturing cost.

Various characteristics of the organic light emitting device shown in FIG. 3 are applicable to the organic light emitting device shown in FIG. 11.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
   a substrate comprising a first region, a second region, a third region, and a fourth region;
   a thin film structure disposed on the substrate;
   first, second, and third color filters disposed on the thin film structure, and respectively disposed in the first, second, and third regions;
   an insulating layer disposed on the first to third color filters and the thin film structure;
   first, second, third, and fourth transflective members disposed on the insulating layer, and respectively disposed in the first, second, third, and fourth regions;
   first, second, third, and fourth pixel electrodes respectively disposed on the first, second, third, and fourth transflective members;
   an organic light emitting member emitting white light disposed on the first to fourth pixel electrodes; and
   a common electrode disposed on the organic light emitting member.

2. The organic light emitting device of claim 1, wherein each thickness between the upper surface of the first, second and third transflective members and the lower surface of the common electrode is substantially the same.

3. The organic light emitting device of claim 2, wherein each thickness between the upper surface of the first to fourth transflective members and the lower surface of the common electrode is substantially the same.

4. The organic light emitting device of claim 3, wherein each thickness between the upper surface of the first, second, third, and fourth transflective members and the lower surface of the common electrode is in the range of 6100 Å to about 6700 Å.

5. The organic light emitting device of claim 1, wherein the first, second, third, and fourth transflective members comprise silver, aluminum, or magnesium.

6. The organic light emitting device of claim 1, wherein the insulating layer comprises an organic material.

7. The organic light emitting device of claim 6, wherein at least one of the first, second, third, or fourth transflective members comprises a dual-layer structure.

8. The organic light emitting device of claim 7, wherein a lower layer of the dual-layer structure comprises ITO or IZO, and an upper layer of the dual-layer structure comprises silver, aluminum, or magnesium.

9. The organic light emitting device of claim 1, wherein the insulating layer comprises an inorganic material.

10. The organic light emitting device of claim 9, wherein the insulating layer comprises silicon oxide or silicon nitride.

11. An organic light emitting device comprising:
a thin film structure disposed on a substrate;
an insulating layer disposed on the thin film structure;
a first transflective member disposed on the insulating layer;
a first pixel electrode disposed on the first transflective member;
an organic light emitting member disposed on the first pixel electrode; and
a common electrode disposed on the organic light emitting member,
wherein a thickness between an upper surface of the transflective member and a lower surface of the common electrode is in range of about 6100 Å to about 6700 Å.

12. The organic light emitting device of claim 11, wherein the first transflective member comprises silver, aluminum, or magnesium.

13. The organic light emitting device of claim 11, wherein the insulating layer comprises an organic material.

14. The organic light emitting device of claim 13, wherein the first transflective member comprises a dual-layer structure.

15. The organic light emitting device of claim 14, wherein a lower layer of the first transflective member comprises ITO or IZO, and an upper layer of the first transflective member comprises silver, aluminum, or magnesium.

16. The organic light emitting device of claim 11, wherein the insulating layer comprises an inorganic material.

17. The organic light emitting device of claim 16, wherein the insulating layer comprises silicon oxide or silicon nitride.

18. The organic light emitting device of claim 11, further comprising:
a color filter disposed between the thin film structure and the insulating layer;
a second transflective member disposed on the color filter; and
a second pixel electrode disposed on the second transflective member,
wherein the thickness between the upper surface of the second transflective member and the lower surface of the common electrode is in the range of about 6100 Å to about 6700 Å.

19. The organic light emitting device of claim 18, wherein the second transflective member comprises silver, aluminum, or magnesium.

20. The organic light emitting device of claim 19, wherein the second transflective member comprises a dual-layer structure,
a lower layer of the second transflective member comprises ITO or IZO, and
an upper layer comprises silver, aluminum, or magnesium.

21. The organic light emitting device of claim 18, wherein the color filter comprises at least one of red, green, or blue color filter.

* * * * *